United States Patent
Doyle

(10) Patent No.: US 8,219,176 B2
(45) Date of Patent: Jul. 10, 2012

(54) SINGLE COIL PARALLEL IMAGING

(75) Inventor: Mark Doyle, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 963 days.

(21) Appl. No.: 11/890,610

(22) Filed: Aug. 7, 2007

(65) Prior Publication Data

US 2008/0221433 A1   Sep. 11, 2008

Related U.S. Application Data

(63) Continuation-in-part of application No. 11/715,755, filed on Mar. 8, 2007, now Pat. No. 7,907,760.

(51) Int. Cl.
*A61B 5/05* (2006.01)
(52) U.S. Cl. .......................... 600/410; 382/128
(58) Field of Classification Search .................. 600/411, 600/410, 425; 382/128, 131, 270, 280, 284, 382/299, 320; 324/76.1, 228, 309
See application file for complete search history.

(56) References Cited

U.S. PATENT DOCUMENTS

| | | |
|---|---|---|
| 4,310,799 A | 1/1982 | Hutchison et al. |
| 4,727,327 A | 2/1988 | Toyoshima et al. |
| 4,829,252 A | 5/1989 | Kaufman |
| 4,973,906 A | 11/1990 | Bernstein |
| 5,034,692 A | 7/1991 | Laub et al. |
| 5,160,889 A | 11/1992 | Scheidegger et al. |
| 5,204,627 A | 4/1993 | Mistretta et al. |
| 5,305,749 A | 4/1994 | Li et al. |
| 5,417,213 A | 5/1995 | Prince |
| 5,525,904 A | 6/1996 | Hanley et al. |
| 5,668,474 A | 9/1997 | Heid |
| 5,713,358 A | 2/1998 | Mistretta et al. |
| 5,910,728 A | 6/1999 | Sodickson |
| 6,088,611 A | 7/2000 | Lauterbur et al. |
| 6,233,475 B1 | 5/2001 | Kim et al. |

(Continued)

FOREIGN PATENT DOCUMENTS

EP   0430104 A2   6/1991

(Continued)

OTHER PUBLICATIONS

Weiger et al. 2D Sense for faster 3D MRI. Magnetic Resonance Materials in Physics, Biology and Medicine. 12:10-19. 2002.*

(Continued)

*Primary Examiner* — Parikha Mehta
(74) *Attorney, Agent, or Firm* — Fox Rothschild LLP

(57) ABSTRACT

An imaging apparatus for an object in change includes an MRI system having a first channel which produces images of the object using alternate lines of k-space applied along each of the two phase encoding directions and a computer which combines the individual images into a composite 3D image. The MRI system acquires alternate lines of temporally resolved data along each phase encoding direction. A method for imaging an object in change includes producing an individual image of the object with a first channel of an MRI system using alternate lines of k-space applied for each phase encoding direction, producing an individual image of the object with at least a second channel of the MRI system by acquiring alternate lines of temporally resolved data using alternate lines of k-space, and combining the individual images into a composite 3D image of the object with a computer of the MRI system.

8 Claims, 11 Drawing Sheets

U.S. PATENT DOCUMENTS

| | | | |
|---|---|---|---|
| 6,259,940 | B1 | 7/2001 | Bernstein et al. |
| 6,275,037 | B1 | 8/2001 | Harvey et al. |
| 6,307,368 | B1 | 10/2001 | Vasanawala et al. |
| 6,310,478 | B1 | 10/2001 | Heid |
| 6,487,435 | B2 | 11/2002 | Mistretta et al. |
| 6,630,828 | B1 | 10/2003 | Mistretta et al. |
| 6,771,067 | B2 | 8/2004 | Kellman et al. |
| 6,794,867 | B1 | 9/2004 | Block et al. |
| 6,975,115 | B1 | 12/2005 | Fujita et al. |
| 7,005,853 | B2 | 2/2006 | Tsao et al. |
| 7,020,509 | B2 | 3/2006 | Heid |
| 7,023,207 | B1 | 4/2006 | Gaddipati et al. |
| 7,202,663 | B2 | 4/2007 | Huang |
| 7,245,125 | B2 | 7/2007 | Harer et al. |
| 7,253,620 | B1 | 8/2007 | Derbyshire et al. |
| 7,486,074 | B2 | 2/2009 | McKenzie et al. |
| 7,541,808 | B2 | 6/2009 | Doyle |
| 7,683,614 | B2 | 3/2010 | Posse |
| 7,693,563 | B2 | 4/2010 | Suresh et al. |
| 2003/0166999 | A1 | 9/2003 | Liu et al. |
| 2003/0169043 | A1 | 9/2003 | Hoshino |
| 2004/0051529 | A1* | 3/2004 | Zhu et al. ............ 324/318 |
| 2004/0254447 | A1 | 12/2004 | Block et al. |
| 2005/0007112 | A1 | 1/2005 | Deimling |
| 2005/0251023 | A1 | 11/2005 | Kannengiesser et al. |
| 2006/0036154 | A1 | 2/2006 | Deimling |
| 2006/0050981 | A1* | 3/2006 | Huang ............... 382/254 |
| 2007/0063701 | A1 | 3/2007 | Vu |
| 2007/0110290 | A1 | 5/2007 | Chang et al. |
| 2007/0159174 | A1 | 7/2007 | Oshio |
| 2007/0242866 | A1 | 10/2007 | Schmitt et al. |
| 2008/0021304 | A1 | 1/2008 | Stemmer |
| 2008/0175458 | A1* | 7/2008 | Guo et al. ............ 382/131 |
| 2009/0105582 | A1* | 4/2009 | Dougherty et al. ...... 600/420 |

FOREIGN PATENT DOCUMENTS

| | | |
|---|---|---|
| EP | 0924530 A2 | 6/1999 |
| GB | 2034123 A | 5/1980 |
| JP | 06 237910 A | 8/1994 |
| WO | WO 90/02344 | 3/1990 |
| WO | WO 90/12329 | 10/1990 |
| WO | WO 91/13367 A1 | 9/1991 |
| WO | WO 94/29741 A1 | 12/1994 |
| WO | WO 2006/120583 A | 11/2006 |

OTHER PUBLICATIONS

Doyle et al. "Block Regional Interpolation Scheme for K-Space (BRISK): A Rapid Cardiac Imaging Technique" 1995, Magnetic Resonance in Medicine, Academic Press (Duluth, MN, US) 33:163-170.

Geier et al. "Parallel Acquisition for Effective Density Weighted Imaging: PLANED Imaging" 2007, Magnetic Resonance Materials in Physics, Biology and Medicine, Chapman and Hall (London, GB) 20(1):19-25).

Kozerke et al. "Accelerating Cardiac Cine 3D Imaging Using k-t BLAST" 2004, Magnetic Resonance in Medicine, Wiley-Liss, Inc. 52:19-26.

Lethmate et al. "Dynamic MR-Imaging with Radial Scanning, a Post-Acquisition Keyhole Approach" 2003, EURASIP J. on app. Signal Processing, Hindawi Publishing Corp. p. 405-412.

Pipe "Reconstructing MR Images From Undersampled Data: Data-Weighting Considerations" 2000, Magnetic Resonance in Medicine, Academic Press (Duluth, MN, US) 43(6):867-875.

Rehwald et al. "Theory of High-Speed MR Imaging o the Human Heart with the Selective Line Acquisition Mode" 2001, Radiology 220(2):540-547.

Tsai et al. "Reduced Aliasing Artifacts using Variable-Density k-Space Sampling Trajectories" 2000, Magnetic Resonance in Medicine, Academic Press (Duluth, MN, US) 43(3):452-458.

Tsao et al. "Eight-fold acceleration in real-time cardiac imaging using k-t BLAST and k-t SENSE with SSFP and segmented EPI" 2003, Proc. Intl. soc. Mag. Reson. Med. 11:209.

Tsao et al. "k-t BLAST and k-t SENSE: Dynamic MRI With High Frame Rate Exploiting Spatiotemporal Correlations" 2003, Magnetic Resonance in Medicine, Wiley-Liss, Inc. 50(5):1031-1042.

Goldfarb "Targeted Rotational Magnetic Resonance Angiography (TROTA): 2D Projection Imaging with 3D Reconstruction" 2004, Proceedings of the International Society for Magnetic Resonance in Medicine, 12th Scientific Meeting and Exhibition (Kyoto, JP) 11:2109.

Gurr et al. "Polar Phase Encode Placement for 3D Acquisition with time-resolved projections" 2003, Proceedings of the International Society for Magnetic Resonance in Medicine, 11th Scientific Meeting and Exhibition (Toronto, Canada 11:1349.

Lin et al. "Blood Attenuation with SSFP-Compatible Saturation (BASS)" 2006, Journal of Magnetic Resonance Imaging, Society for Magnetic Resonance Imaging (Oak Brook, IL, US) 24:701-707.

Uribe et al. "Integration of Magnetization Preparation Sequences into SSFP Sequences: A Fat Saturation Example" 2008, Proceedings of the International Society for Magnetic Resonance in Medicine, 16th Scientific Meeting and Exhibition (Toronto, Canada) p. 1402.

Werner et al. "Continuous Artery-Selective Spin Labeling (CASSL)" 2005, Magnetic Resonance in Medicine, Academic Press (Duluth, MN, US) 53:1006-1012.

Herzka et al. "Myocardial tagging with SSFP" 2003, Magnetic Resonance in Medicine, Academic Press (Duluth, MN, US) 49:329-340 (XP002548177).

Herzka et al. "Multishot EPI-SSFP in the Heart" 2002, Magnetic Resonance in Medicine, Academic Press (Duluth, MN, US) 47(4):655-664 (XP002526274).

Pai "PTAGs: Partial k-space tagging combined with SSFP" 2006, Proceedings of the Int'l Society for Magnetic Resonance in Medicine, 14th Scientific Meeting and Exhibition (Seattle, WA, US) p. 1216 (XP002548176).

Stainsby et al. "Visualizing flow using MR tagging and Fiesta Imaging" 2005, Proceedings of the Int'l Society for Magnetic Resonance in Medicine, 13th Scientific Meeting and Exhibition (Miami Beach, FL, US) p. 2382 (XP002548178).

Witschey et al. "Balanced steady-state free precession spatial gridding" 2008, Proceedings of the Int'l Society for Magnetic Resonance in Medicine, 16th Scientific Meeting and Exhibition (Toronto, Canada) p. 1404 (XP002548175).

Griswold et al. "Autocalibrated coil sensitivity estimation for parallel imaging" 2006, NMR in Biomedicine, Wiley (London, GB) 19:316-324.

Kellman et al. "Adaptive Sensitivity Encoding Incorporating Temporal Filtering (TSENSE)" 2001, Magnetic Resonance in Medicine, Academic Press (Duluth, MN, US) 45(5):846-852.

Madore et al. "Unaliasing by Fourier-Encoding the Overlaps Using the Temporal Dimension (Unfold), Applied to Cardiac Imaging and FMRI" Magnetic Resonance in Medicine, Academic Press (Duluth, MN, US) 42:813-828 1999.

Song et al. "Dynamic MRI with projection reconstruction and KWIC processing for simultaneous high spatial and temporal resolution" 2004, Magnetic Resonance in Medicine, Academic Press (Duluth, MN, US) 52(4):815-824.

Maier et al. "Accurate Velocity Mapping with FAcE" 1996, Magnetic Resonance Imaging, Elsevier Science, Inc. (USA) 14(2):163-171.

* cited by examiner

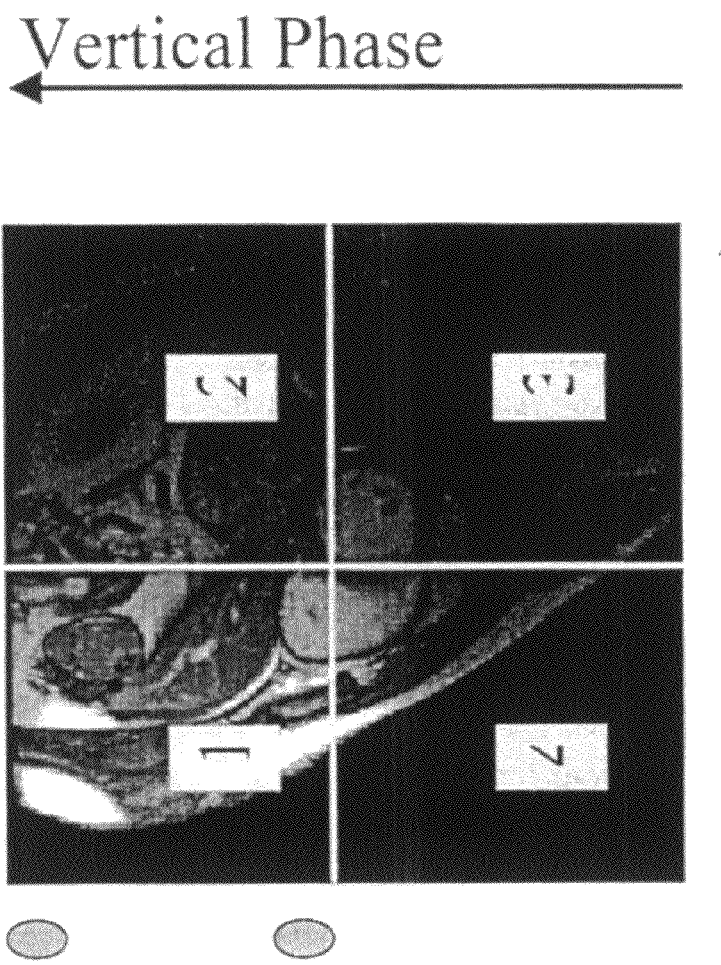

Folded Over Image

Full FOV Image

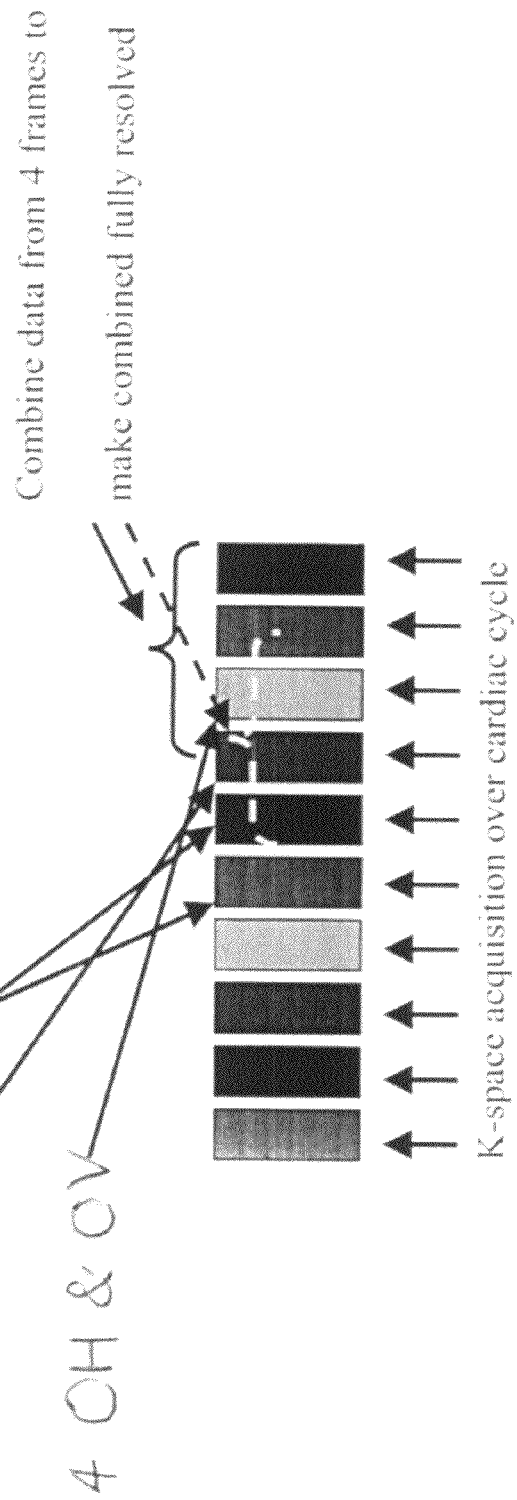

Full FOV image

Unfolded Image,

Folded over image

SINGLE COIL PARALLEL IMAGING

This application is a continuation-in-part of, and claims priority to, U.S. patent application Ser. No. 11/715,755 entitled "Single Coil Parallel Imaging" and filed on Mar. 8, 2007 now U.S. Pat. No. 7,907,760. The disclosure of U.S. patent application Ser. No. 11/715,755 is incorporated herein in its entirety.

FIELD OF THE INVENTION

The present invention is related to the 3D imaging of an object in change using an MRI. More specifically, the present invention is related to the 3D imaging of an object in change using an MRI with a single coil element by itself or independent of other single coil elements of the MRI which produce corresponding images that are combined to form a composite image of the object.

BACKGROUND OF THE INVENTION

There are two imaging technologies, 1) Reduced field of View Imaging and 2) Parallel Imaging, which go under several names, the two most fundamental are SENSE and SMASH. When a factor of two in time reduction is required, all of the above approaches use the same k-space sampling pattern, i.e. every other line of k-space is sampled.

The Reduced Field of View approach assumes that only a part of the field of view is dynamic, and that the fold over information can be removed by subtracting that information from a previously acquired fully resolved image.

The SMASH and SENSE approaches are related in that they use the sensitivity profiles of separate receiver coils to remove the folded over data. They rely on using two or more receiver coils, each with a distinctly different sensitivity profile to the body section being imaged. Essentially, the folded over data are removed for images in pairs (or higher combinations) of coils with each image pair having different sensitivity characteristics as determined by the coils. The SMASH approach performs this disentangling operation in the k-space domain, while the SENSE approach performs this operation in the image domain.

BRIEF SUMMARY OF THE INVENTION

The present invention pertains to an imaging apparatus for an object in change. The apparatus comprises an MRI system having a computer, a first channel and at least a second channel which produce corresponding images of the object in change, preferably using alternate lines of k-space. The computer combining the individual images into a composite image of the object. The MRI system acquiring alternate lines of temporally resolved data.

The present invention pertains to an imaging apparatus for an object in change. The apparatus comprises an MRI system having a computer, and at least a first channel which produces an image of the object in change from data acquired in k-space domain in a density of at least ½ that required to satisfy the Nyquist criteria.

The present invention pertains to a method for imaging an object in change. The method comprises the steps of producing an individual image of the object in change with a first channel of an MRI system, preferably using alternate lines of k-space. There is the step of producing an individual image of the object in change with at least a second channel of the MRI system independent of the first channel by acquiring alternate lines of temporally resolved data, preferably using alternate lines of k-space. There is the step of combining the individual images into a composite image of the object with a computer of the MRI system.

The present invention pertains to an imaging apparatus for an object in change. The apparatus comprises an MRI system having a computer, a first channel which produces images of the object in change using alternate lines of k-space applied along each of the two phase encoding directions. The computer combining the individual images into a composite 3D image of the object. The MRI system acquiring alternate lines of temporally resolved data along each of the phase encoding directions, such that at any one time point at least 25% of full data is acquired. Full data being defined as k-space data that satisfies the Nyquist sampling criteria.

The present invention pertains to a method for imaging an object in change. The method comprises the steps of producing an individual image of the object in change with a first channel of an MRI system using alternate lines of k-space applied for each phase encoding direction. There is the step of producing an individual image of the object in change with at least a second channel of the MRI system independent of the first channel by acquiring alternate lines of temporally resolved data using alternate lines of k-space. There is the step of combining the individual images into a composite 3D image of the object with a computer of the MRI system.

BRIEF DESCRIPTION OF THE SEVERAL VIEWS OF THE DRAWING

In the accompanying drawings, the preferred embodiment of the invention and preferred methods of practicing the invention are illustrated in which:

FIG. 19 (3D) shows a typical configuration for 3D imaging, in which a coil element is positioned primarily over one quadrant of the image (a single 2D slice from the 3D data set is represented) and that in 3D imaging, there are two phase encoding axes, termed "Horizontal" and "Vertical" here.

FIG. 21 (3D) shows that in a 3D acquisition, when acquiring alternate phase encoding lines along the two phase encoding axes, that the order of lines can be cycled between even and odd lines, and between "Horizontal" and "Vertical" phase encoding axes, such that four successive data sets can be combined to produce a fully sampled 3D data set.

DETAILED DESCRIPTION OF THE INVENTION

Figure 16:
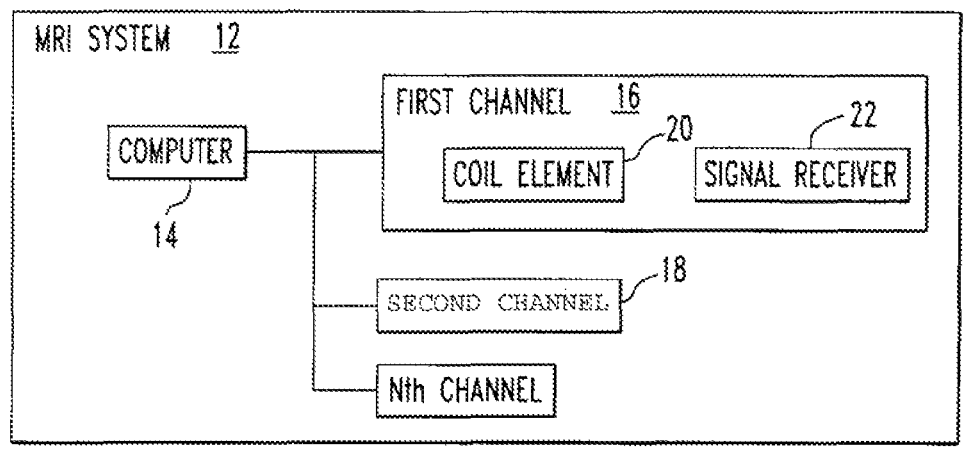
FIG. 16 is a block diagram of the imaging apparatus of the present invention.
Figure 17A:
FIGS. 17A-17D show a simulation of single coil parallel imaging (17A and 17C) and corresponding single coil parallel images (17B and 17D).
Figure 17B:
Figure 17C:
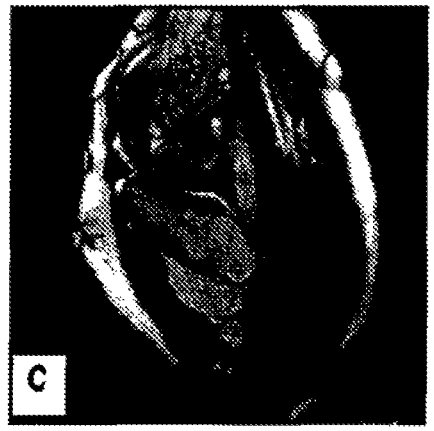
Figure 17D:

Referring now to the drawings wherein like reference numerals refer to similar or identical parts throughout the several views, and more specifically to FIG. 16 thereof, there is shown an imaging apparatus 10 for an object in change. The apparatus 10 comprises an MRI system 12 having a computer 14, a first channel 16 and at least a second channel 18 which produce corresponding images of the object in change, preferably using alternate lines of k-space. The computer 14 combines the individual images into a composite image of the object. The MRI system acquires alternate lines of temporally resolved data.

The MRI system 12 preferably requires at least one frame of temporally resolved data at full resolution. Preferably, each channel includes a coil element 20 and a signal receiver 22, for each channel, retains image data corresponding to a region closest to the coil element 20, the region including at least 50% of the data. The at least one frame of temporally resolved data at full resolution is preferably acquired over two time frames, which may be consecutive or temporally distributed.

The present invention pertains to an imaging apparatus 10 for an object in change. The apparatus 10 comprises an MRI system 12 having a computer 14, a first channel 16 which produces images of the object in change using alternate lines of k-space applied along each of two phase encoding directions. The computer 14 combines the individual images into a composite 3D image of the object. The MRI system 12 acquiring alternate lines of temporally resolved data along each of the phase encoding directions, such that at any one time point at least 25% of full (satisfying Nyquist sampling criteria) data are acquired.

The MRI system 12 can acquire even lined datasets only of even lines during even-numbered time points in a series and odd lined data points only of odd lines during odd numbered time points in the series. Alternatively, at each time point the MRI system 12 acquires alternate lines along each phase encoding direction including all even lines or all odd lines and additionally a contiguous number of lines at each time point near the center of k-space (e.g. 10% of the data required to satisfying Nyquist sampling criteria for the fully resolved data set).

Preferably, there is at least a second channel 18 and each channel 16, 18 includes a coil element 20 and a signal receiver 22 which retains image data corresponding to a region closest to the coil element 20. The region includes at least 25% of the data. The MRI system 12 preferably acquires the alternate lines in a progressive manner along each of two phase encoding axes such that a full dataset having all even and all odd lined datasets can be combined from every four consecutive time frames. Alternately, if the central region of k-space is acquired at each time point, then this data is used to produce a correctly ordered image that is of low resolution. The low resolution image does not suffer from signal aliasing, but renders images without sharp features, showing only the general intensity distribution without incorporating fine image detail.

The even lined datasets can correspond to even-numbered cardiac phases and odd lined datasets correspond to odd-numbered cardiac phases. Alternatively, similar alternate lined datasets are acquired at each time point.

Preferably, the computer 14 forms a ratio map for each coil element 20 separately using the corresponding fully solved image. The ratio map preferably is formed by the computer using the following formula $$R = PP/(RP2 + RP3 + RP4)$$

where R is the ratio map value, PP is the primary pixel which is the pixel in a fully resolved image quadrant, referred to here as quadrant 1, closest to the coil element 20 and RP2, RP3, and RP4 are pixel values in remote quadrants, referred to as quadrants 2, 3, and 4, respectively.

Preferably, the ratio map for an individual channel corresponds to an intensity ratio of pixels that would overlap in an approximately 25% folded over image. The computer 14 preferably uses the ratio map to distribute pixel intensity only to the primary pixel closest to the coil element 20. Preferably, a composite pixel is assigned to a primary unfolded pixel position, forming an image of at least 25% of the fully resolved image according to the formula $$\text{primary pixel intensity} = R \times C/(R+1)$$

where R is the ratio value and C is the observed intensity in the folded over image.

The present invention pertains to a method for imaging an object in change. The method comprises the steps of producing an individual image of the object in change with a first channel 16 of an MRI system 12 using alternate lines of k-space applied for each phase encoding direction. There is the step of producing an individual image of the object in change with at least a second channel 18 of the MRI system 12 independent of the first channel 16 by acquiring alternate lines of temporally resolved data using alternate lines of k-space. There is the step of combining the individual images into a composite 3D image of the object with a computer 14 of the MRI system 12.

As an alternative step to acquiring only one fully resolved 2D frame, instead acquire alternate lines in the manner such that only even lines are acquired during alternate cardiac phases (e.g. acquire only even line during even numbered cardiac phases) and only acquire odd lines during the interleaved cardiac phases (e.g. acquire odd lines during odd numbered cardiac phases). In this variation, instead of producing a single fully resolved cardiac phase at one point in the cycle, the alternating even and odd lined data sets can be progressively combined for adjacent time point data sets to produce a dynamic series of fully resolved images, albeit, images that exhibit motion artifact and distortion due to being formed from data spanning two cardiac phase intervals.

When applied to 3D data in change, an alternative step to acquiring only one fully resolved 3D data set, is to acquire alternate lines in a progressive manner along each of the two phase encoding axes, 31, such that a full data set (i.e. all even and all odd lines) can be compiled from every 4 consecutive time frames. For example, when considering the phase encoding directions to be labeled "Horizontal" and "Vertical", the alternate line series acquired in four successive cardiac frames would be "EH & EV", "OH & EV", "EH & OV", and "OH & OV", where "O" indicates "odd lines", "E" indicates "Even lines", "H" indicates "Horizontal phase encoding" and "V" indicates "Vertical phase encoding". By cyclically acquiring the sparse data in this manner, the alternating even and odd lined data sets can be progressively combined in groups of four to produce a dynamic series of fully resolved images, albeit, images that experience motion artifact and distortion due to being combined from data spanning four cardiac phase intervals.

For the 2D version, preferably, the individual image from each coil is imaged at different intensities to form a fully resolved image. The computer 14 preferably forms a ratio map for each coil separately using the corresponding fully resolved image(s). Preferably, the ratio map for an individual channel corresponds to an intensity ratio of pixels that would overlap in an approximately 50% folded over image. The computer 14 preferably uses the ratio map to distribute pixel intensity between a first pixel closest to the coil and a second pixel more remote to the coil than the first pixel.

In the variation in which a dynamic series of fully resolved images are obtained, using the image series contaminated by motion artifacts and distortions the ratio maps can be formed in the following manner, which reduces the influence of motion artifacts: A) For the temporally composite images, find the mean and standard deviation of temporal data for each pixel location. B) Form an image weighted towards the high pixel intensities by averaging only pixel intensities laying between the mean and mean plus two standard deviations, referred to herein as the "Max image". C) Form an image weighted towards the low pixel intensities by averaging only pixel intensities lying between the mean and mean minus two standard deviations, herein referred to as the "Min image". D) Form a composite image by assigning the "Max image" intensities to the dominant image side and the "Min image" intensities to the remote image side. The ratio map of pixels that would overlap in a 50% folded over image is generated using this composite image, referred to herein as the "max-min ratio map".

For the extension to 3D imaging, preferably, the individual image from each coil element is imaged at different intensities to form a fully resolved image or image series, 29. The computer 14 preferably forms a ratio map for each coil separately using the corresponding fully resolved image. Preferably, the ratio map for an individual channel corresponds to an intensity ratio of the set of four pixels that would overlap in an approximately 25% folded over image, 30, with the fold over direction being applied to each of the two phase encoding directions used in 3D imaging. The ratio map is established in the following manner: 1) the numerator is formed by the primary pixel intensity (i.e. the pixel in the contiguous volume closest to the imaging coil element), and 2) the denominator is formed by combining by addition the three corresponding pixels that would overlap the primary pixel). The computer 14 preferably uses the ratio map to distribute pixel intensity to the primary pixel closest to the coil element 32.

In the 2D case, preferably, the composite pixel is split between two unfolded pixel positions according to the formula closest pixel intensity=$R \times C/(R+1)$ where R is the ratio value and C is the observed intensity in the folded over image, and furthest pixel intensity=$C$-closest pixel intensity.

When the invention is applied to 3D data in change, the composite pixel intensity only is assigned to the dominant pixel position according to the formula closest pixel intensity=$R \times C/(R+1)$ where R is the ratio value suitable for 3D data (i.e. ratio of primary pixel to the sum of the three remote pixels) and C is the observed intensity in the folded over image, 32. Other pixels remote from the primary coil element quadrant are not assigned in the typical case, since there is not generally a strong means of differentiating between them. However, it is feasible to assign intensities to each of the three pixels based on the formula $PI_r = R_r \times (C$-closest pixel intensity$)/(R_r+1)$.

where $PI_r$ is the pixel intensity for remote pixel "r", $R_r$ is the ratio value for the primary pixel and the remote pixel "r", C is the observed intensity in the folded over image, and "Closest pixel intensity" is the value assigned to the primary pixel.

The computer 14 preferably forms the composite image by setting pixels of the individual image of the first channel 16 with no overlap with the individual image of the second channel 18 to the value of the pixel of the first individual image. Preferably, the computer 14 forms the composite image with composite pixels with non-zero values of the individual images that overlap equal to the square root of the sum of the squares of the individual pixels which overlap.

The present invention pertains to an imaging apparatus 10 for an object in change. The apparatus 10 comprises an MRI system 12 having a computer 14, and at least a first channel 16 which produce an image of the object in change from data acquired in k-space domain in a density of at least ⅔ and preferably at least ½ that required to satisfy the Nyquist criteria in the 2D case.

The present invention pertains to a method for imaging an object in change. The method comprises the steps of producing an individual image of the object in change with a first channel 16 of an MRI system 12, preferably using alternate lines of k-space. There is the step of producing an individual image of the object in change with at least a second channel 18 of the MRI system 12 independent of the first channel 16 by acquiring alternate lines of temporally resolved data, preferably using alternate lines of k-space. There is the step of combining the individual images into a composite image of the object with a computer 14 of the MRI system 12.

Preferably, the producing the individual image of the object in change with the first channel 16 step includes the step of acquiring alternate lines of temporally resolved data. The producing the individual image of the object in change with the first channel 16 step preferably includes the step of acquiring at least one frame of temporally resolved data at full resolution. Preferably, each channel includes a coil element 20 and a signal receiver 22, and there is the step of retaining image data corresponding to a region closest to the coil element 20, the region including at least 50% of the data, for each channel in the 2D case.

The step of acquiring at least one frame of temporally resolved data at full resolution step preferably includes the step of acquiring at least one frame of temporally resolved data at full resolution over two time frames, which may be consecutive or temporally distributed. Preferably, the producing the individual image of the object in change with the first channel 16 step includes the step of imaging the individual image with the coil element 20 at different intensities. There is preferably the step of forming a ratio map for each coil separately using the corresponding fully resolved image with the computer 14. Preferably, the ratio map forming step includes the step of forming the ratio map for an individual channel corresponding to an intensity ratio of pixels that would overlap in an approximately 50% folded over image.

In the operation of the invention, the key features of the single coil parallel imaging scheme are:

1. The sampling pattern of obtaining alternate lines of k-space is commonly used in the so-called parallel imaging approaches. The unique feature here is that the approach only requires a single coil to work. Whereas parallel imaging requires multiple coils to be used simultaneously.
2. In parallel imaging, the signal to noise that is ultimately realized is dependant on the detailed manner in which multiple coils interact. This is characterized by the so-called G factor (goodness factor). A G-factor of 1 indicates that the coils and signal processing perform optimally, and typically values of 1.2 and higher are achieved, indicating that less than optimal image signal to noise ratio is achieved. In the current invention, in the 2D case, the ratio map of each coil element 20 from one half to the other is used to remove fold over artifact, and in the 3D case, the ratio map from the primary quadrant to a combination of the three remote quadrants is used to remove fold over artifact. In a strict sense, this can only be done in an approximate manner, while the parallel imaging approaches can, in theory, unambiguously assign correct pixel values. Given this, it may seem that the current invention performs poorly compared to parallel imaging, and would not have any further value. However, in practice, the G-factors, and other implementation errors significantly degrade parallel images, such that artifacts are discernible, and noise levels are noticeably elevated. The current invention has the advantage that noise propagation is low and, in practice, artifact levels are almost indiscernible, giving the approach a practical advantage over parallel approaches.
3. The Reduced Field of View approach uses a similar argument as the current invention to restrict the field of view of the dynamic image portion to 50% of the image width. Typically, this region is assumed to be contiguous. Whereas, in this invention, this restriction does not apply.
4. The Reduced Field of View approach essentially treats the static data portion of the image as a region that has to be subtracted out of the "folded over image". The data subtraction process is responsible for dramatically increasing noise levels in the final image. In the current invention, overlapping signals are "separated" from dynamic tissue by a multiplication operation (the ratio operation), making the noise contribution minimal. This is a key advantage of the current invention.
5. The Reduced Field of View approach essentially has to identify which regions are static and which are dynamic, and the static region then is represented with no temporal changes. Thus, 50% of the image space is static in these approaches, leading to an artificially static image with a dynamic portion embedded in it. In the current invention, each frame has the freedom to represent the dynamic data wherever it should appear, and thus there are no artificially static appearing regions, with each pixel typically having some dynamic content in each frame.

The apparatus 10 is an MRI approach to produce dynamic images in a reduced scan time by exploiting the signal intensity profile of an individual coil element 20 of a phased array receiver coil set (the apparatus 10 can work for a single coil or multiple coils). The MRI signal data is termed k-space. The apparatus 10 samples every other line of k-space for most frames of the dynamic series. In the 2D version, this translates to only acquiring 50% of k-space, and in the 3D version, where there are two independent phase encoding direction, it translates to acquiring 25% of k-space. Additionally, one k-space frame of the series is sampled in its entirety. This can be accomplished by combining data obtained from two or more suitably sampled k-space data sets. The technique requires two commonly met conditions: 1) the intensity of the received signal falls off with distance into the body (this signal characteristic is normally present for each separate element of a typical receiver coil system), and 2) the dynamic feature being imaged occupies approximately 50% of the field of view (this is typically met for cardiac and other imaging situations, although this condition does not have to be rigorously met).

Figure 1:
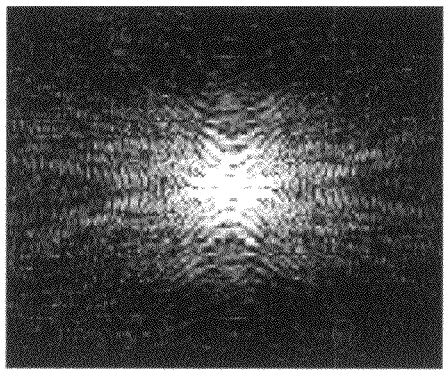
FIG. 1 shows a fully resolved k-space data set that conforms to the Nyquist sampling criteria.
Figure 3:
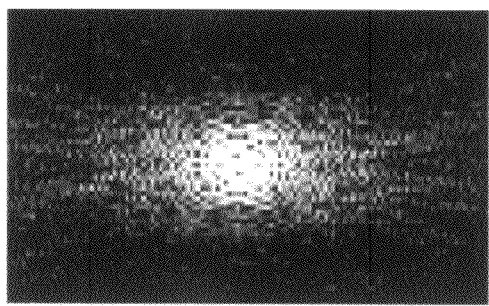
FIG. 3 shows a k-space data set with every other line omitted, i.e. a half data set.
Figure 2:
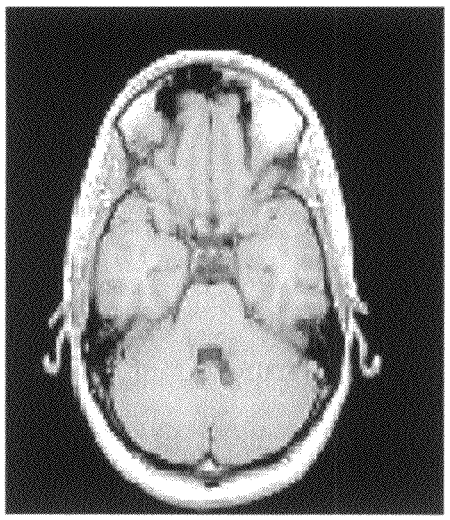
FIG. 2 shows the corresponding MR image generated from the k-space data set of FIG. 1.
Figure 4:
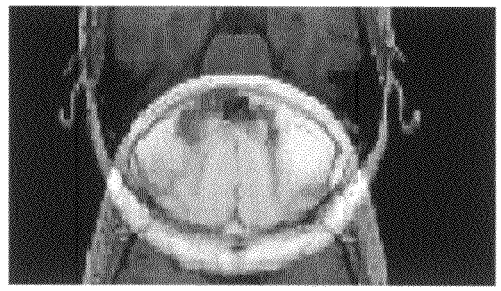
FIG. 4 shows the corresponding MR image generated from the k-space data set shown in FIG. 3, illustrating a half image fold over artifact.
Figure 5:
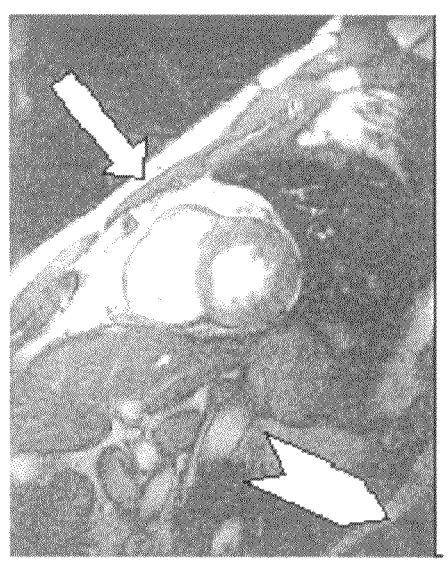
FIG. 5 shows one frame of a cardiac image series seen using only one coil element.
Figure 18:
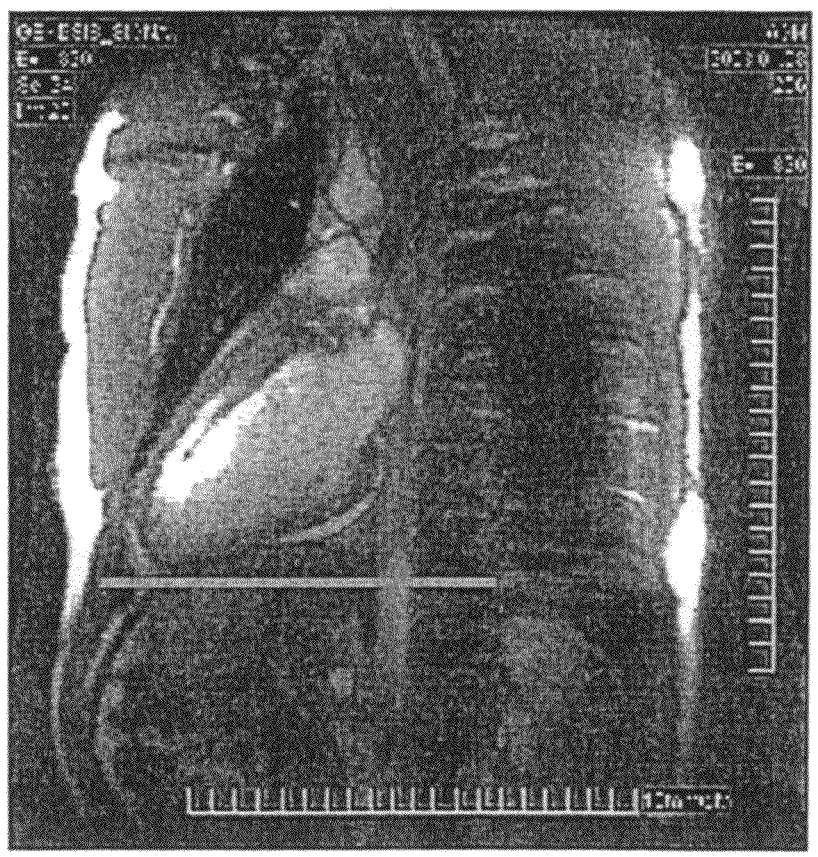
FIG. 18 shows a typical cardiovascular image featuring the heart.

When every line of the k-space data are acquired, the data set is said to be fully sampled, i.e. it satisfies the Nyquist sampling criteria (see below), and the corresponding image generated from it is correctly resolved. FIG. 1 shows a fully resolved k-space data set. The corresponding MR image generated from this is shown in FIG. 2. When every other line of k-space is omitted (reducing the scan time by a factor of 2) the corresponding image is equivalent to superimposing two halves of the original image. FIG. 3 shows a k-space data set with every other line omitted, i.e. a half data set. The corresponding MR image generated from this is shown in FIG. 4, illustrating a half image fold over artifact. It is noted that the final image is derived from a series of separate receiver coil elements 20 (typically 4, 8 or 16). For each receiver coil element 20 each part of the image is seen with different intensity, depending on how close it is to the receiver coil. FIG. 5 shows one frame of a cardiac image series seen using only one coil element 20. In this case, the signal is most intense at the chest wall (arrow), and falls off dramatically towards the back of the subject (chevron). Note also, that typically, for any given line of the image, the dynamic information typically occupies less than 50% of that line. FIG. 18 shows a typical cardiovascular image featuring the heart. In this case, the line represents a region of the image, which corresponds to half of the field of view. This half of the field of view contains the bulk of the image features that exhibit motion, or dynamic changes, from frame to frame. The apparatus 10 utilizes these separate observations in the following way:

For one frame of a dynamic series, all of the k-space lines are acquired, and a fully resolved image is obtained, FIGS. 1 and 2.

From this fully resolved image, the ratio of the first half of the image to the second half is obtained separately for each coil element 20 in the 2D case. The orientation of which image half to use is determined by the "phase encoding" direction used in the MRI sequence.

For every other dynamic time point (e.g. time through the cardiac cycle), k-space data sets are acquired by omitting every alternate line. The images produced by these data sets are folded over by 50%, FIGS. 3 and 4.

When considered for each coil element 20, there are a series of folded over images.

For each coil element 20, the ratio map produced for that coil element is used to disentangle the series of time resolved folded over images using the following formula:

The ratio map is used to multiply the folded over image to determine the relative amount of signal to assign to the un-folded over image pixels. In the 2D case, for each 50% overlap pixel, the larger ratio is assigned to the corresponding pixel closest to the coil and the lower portion is assigned to the corresponding pixel furthest from the coil.

The above algorithm distributes the pixels based on the ratio map and the folded over data obtained from a single coil element.

Since the more distant regions from the coil have low signal to noise ratio, these pixels are typically not well represented by this scheme, since they are very noisy.

Conversely, pixels closest to the coil element 20 are typically well represented by this scheme.

To best represent the pixels, 25% of each line furthest from the receiver coil is set to zero, due to the potential for high artifact in this region.

To form the final image, the series of partial and folded out images from the series of coil elements can be combined by signal averaging. Since the series of coil elements cover the entire slice, the resultant image closely resembles the image that would have been acquired from the fully acquired k-space data set. FIGS. 17A-17D show a simulation of Single Coil Parallel Imaging, showing original frames (17A and 17C) and corresponding Single Coil Parallel Images (17B and 17D). 17A and 17B correspond to early systole and 17C and 17D correspond to late systole.

The k-space data can be acquired in a number of variations for this approach, and one example is given here: the reduced k-space data sets are acquired throughout systole and for most of diastole (for a cardiac series). The single reference frame requiring a full k-space acquisition is acquired at end-diastole spanning two acquisition time slots, when the heart exhibits the least motion.

An alternative manner in which to acquire alternate lines of k-space for the 2D case and ensure that at least one (and likely more than one) image is available to produce the full k-space data set is to acquire even lines on alternate cardiac phases and odd lines in the interleaved positions. This acquisition scheme still allows the requirement that alternate lines of k-space are acquired for each cardiac phase, while also allowing a time series of full images from which to compile the ration map.

A further alternative manner in which to acquire alternate lines of k-space for the 2D case and ensure that at least one (and likely more than one) image is available to produce the un-aliased image(s) is to acquire even lines only at each cardiac phases. In addition to these lines, acquire a small percentage (e.g. 10%) of lines in a contiguous manner near the center of k-space. This acquisition scheme still allows the requirement that alternate lines of k-space are acquired for each cardiac phase, while also allowing a time series of low resolution images from which to compile the ration map, the low resolution images being formed only using the contagious lines of k-space. In this example where 10% of lines are acquired in a contiguous manner, only 5% of lines are acquired additionally to the even lines acquired for the scan, and thus the overhead of this approach is low, while allowing consistent image quality and appearance, since each image in the series is generated from a series of lines (e.g. even lines) that have similar fold over characteristics.

In the 3D version, sampling of even and odd lines in an interleaved manner forms a series of 4 distinct sampling patterns, since there are two phase encoding directions, (FIG. 19). In this case, combining data from 4 successive time frames is necessary to produce a fully resolved image.

As in the 2D case, the 3D acquisition can be conducted such that the same series of alternate lines are acquired at each time point. In this case, to produce an image series to form the ratio map, a small (e.g. 10%) number of contiguous lines can be sampled near the center of k-space. The contiguously sampled lines are then used to produce a series of un-aliased, but low resolution, images from which to generate the ratio map.

In the 3D example, in each reduced data set, four pixels overlap onto one position, FIG. 20, with one of the pixels being from the primary quadrant (closest to the receiver coil element) and three of the pixels are of relatively low intensity, FIG. 19. The ratio map is formed based on the ratio of intensity of the corresponding pixel in the primary quadrant to the sum of pixels in the three secondary quadrants. The ratio map can be based on a single representative frame or on the "max-min" ratio map (described above). Typically, in the case of 3D data, the ratio map operation acts to assign pixel intensity only to the primary quadrant, FIG. 22. However, pixel assignment to the three remote quadrants can be accomplished, but typically will suffer dominant levels of artifact due to the low intensities of these pixels. Forming a full FOV image, with intensity in all quadrants can be accomplished by reconstructing the quadrants individually, using the signal acquired from the respective coil element closest to that quadrant.

The apparatus 10 can be used in MR scanners to reduce the scan time for cardiac imaging, or for any imaging sequence that requires dynamic data, examples include: time resolved magnetic resonance angiography, real-time approaches to monitor interventions and procedures, and time resolved imaging to observe the kinetics of a contrast agent.

The approach herein can be interpreted as a hybrid between parallel imaging and Reduced Field of View approaches. It incorporates many of the key advantages of the other two classes of rapid imaging approach without suffering many of the key disadvantages. Of note is that data for each of three rapid imaging approaches: 1) Reduced Field of View, 2) parallel imaging, 3) and the current invention, are acquired with very similar k-space sampling strategies where alternate lines of k-space are sampled. Thus, the key feature distinguishing them is related to the image/signal processing routine used to produce the final image, which in turn is governed by the physical principle being exploited. To best appreciate the advantages of the current invention, it is convenient to consider that conventionally, the image reconstructed from sampling alternate lines of k-space is presented as a folded-over image, i.e. one contiguous half of the image is folded over onto the opposing half in the 2D case. The operation of the processing algorithm then is to unfold the image. Further, in approaches that acquire a reduced number of lines of the MRI k-space data, the signal to noise ratio (SNR) is decrease compared to the image that would have been obtained from a full k-space matrix. In a theoretically ideal system, the SNR of the reduced acquisition is given by:

$$SNR(\text{reduced scan}) = SNR(\text{full scan})/\sqrt{R}$$

where R is the sparse sampling factor, e.g. if half the lines are sampled, R=2.

Existing parallel imaging approaches, such as SMASH and SENSE, require the processing of two or more channels of data, and typically introduce significant noise contamination into the processed image. A key condition for the combined data channels to best contribute to conventional parallel imaging is if they have distinctly different sensitivity profiles. The degree to which these sensitivity profiles are not distinct, and with particular reference to how noise is sampled at each spatial location by each coil element 20, is encapsulated in the term commonly called the "g-factor" or "goodness factor". In approaches such as SMASH and SENSE, the g-factor modifies the SNR equation to SNR(reduced scan)=SNR(full scan)/[$g \cdot \sqrt{(R)}$]

Thus, for regions of the image where g is significantly greater than 1, the SNR of that region is noticeably reduced. The g-factor varies over the whole of the imaged volume, and is dependant on multiple factors. However, it is typical for the g-factor to reach an elevated average value of about 1.2 or higher close to the center of the imaged volume. Further, this central region is typically imaged at a lower SNR compared to the periphery of the body by a factor of about 5:1 (depending on coil element 20 size and body region being imaged). Thus, the central region of the image is typically compromised in SNR even in a full scan, and the additional reduction in SNR resulting from elevation of the g-factor typically makes the increase in noise very noticeable. In the current invention, since only one coil is involved in the primary processing routine, the effective g-factor approaches 1. In cardiac imaging in particular, the central region of the image typically contains the heart and vasculature, and thus imaging this region with good SNR often imposes a limiting factor on the acceptable image quality. The higher performance in this region will make the current invention desirable.

In the approach to generating the ratio map based on the "max-min" routine it is feasible that the effective g-factor is less than 1, making the present invention perform in a superior manner to other approaches that acquire a reduced data set. This aspect is based on forming a noise reduced version of the ratio map by use of the selective averaging process that contributes to the "max-min" procedure. Whereas the use of an averaged quantity might be thought to introduce temporal blurring into the unfolded images, the ratio map operates on individual data at each time point in the cardiac cycle, and thus the ratio map unfolding procedure does not introduce appreciable blur and manifests as an improvement in the signal to noise ratio.

In prior approaches that do not use the parallel imaging approaches to reconstruct images from a reduced k-space data set, such as Reduced Field of View imaging, there is an assumption that half of the field of view is occupied by static tissue, and that this static tissue signal can be removed by a post-processing step or steps. While the current invention is expected to perform optimally when this condition is met, this is not a strict requirement for the current invention. The current invention has several advantages:

1) In the prior approaches, a data subtraction operation is performed, and this is an inherently noise amplifying operation, the SNR produced in the final image is lower than the theoretical limit of by a factor of the square root of A SNR(reduced scan)=SNR(full scan)/$\sqrt{(R \cdot A)}$ In the subtraction process, the factor A approaches 2. In the current invention, the folded over data is removed by a multiplication operation, since the ratio of sensitivity between one pixel and the corresponding folded over pixel is used to assign pixel intensity. Since the operation of multiplication does not propagate noise to the extent that subtraction does, the SNR of the final unfolded image approaches the theoretical limit governed by the sparse sampling factor, i.e. the additional noise factor, A, approaches 1.

2) Under conditions that the subtracted signal is not truly static (e.g. slowly varying due to breathing or cardiac tethering), then additional artifacts are introduced due to signal misregistration when it is assumed that one region is truly static. Additionally, in the subtraction-based approaches, there is typically a constraint that the static region is contagious, which is not a requirement for the current invention.

3) Approaches such as UNFOLD were introduced to deal with the removal of image data originating from regions that are not truly static. (Madore B M, Glover G H, Pelc N J. Unaliasing by Fourier encoding the overlaps using the temporal dimension (UNFOLD), applied to cardiac imaging and fMRI. Magn Reson Med 1999; 42:813-828, incorporated by reference herein.) In these approaches, the unfolding operation is performed using temporally close data sets. In effect, these approaches acquire interleaved sparse sampled data (e.g. odd lines are acquired at time point one, even lines are acquired at time point two) and the close proximity of the interleaved data is used to reduce the degree of artifact produced by slowly varying signal components. However, while these approaches reduce the subtraction error of image regions that are not truly static, they necessarily introduce temporal blur into the primary dynamic features of the image (since data are combined from two or more adjacent time points). In the current invention, the information required to remove folded over image regions uses the ratio map from opposite halves of an individual coil element 20. Since this ratio map is static, and independent of temporal changes that occur in the body, the unfolded images are not temporally averaged or distorted.

Example

Figure 7A:
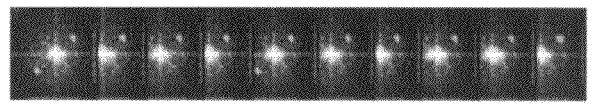
FIG. 7A represents the fully sampled k-space series.
Figure 7B:
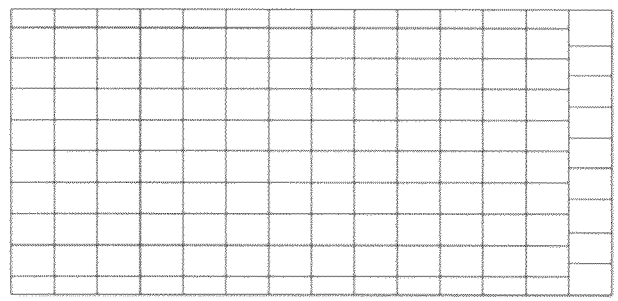
FIG. 7B represents how the sparsely sampled k-space matrix data are acquired at each point in the cardiac cycle.
Figure 7C:
FIG. 7C shows where images are to be represented throughout the cardiac cycle.

The Single Coil Parallel Imaging apparatus 10 involves an acquisition and a processing stage. The acquisition involves acquiring alternate lines of k-space over a time resolved series, e.g. in cardiac imaging, the time dimension represents time over the cardiac cycle. FIGS. 7A-7C show a schematic of one possible manner in which MRI k-space data can be acquired for the Single Coil Parallel Imaging invention. FIG. 7A represents the fully sampled k-space series (i.e. each k-space data set would generate an un-folded over image). FIG. 7C represents where images are to be represented throughout the cardiac cycle, i.e. equally distributed from the start of the cardiac cycle to the end in this example. FIG. 7B represents how the sparsely sampled k-space matrix data are acquired at each point in the cardiac cycle: from the start of the cycle to the penultimate frame, alternate lines of k-space are sampled (e.g. every even line), while for the last frame, alternate lines are sampled, but in this case correspond to the series of lines omitted in the previous frames (e.g. every odd line). In this example, the majority of the cardiac phases have only the even k-space lines acquired, and the very last time frame has the odd lines of k-space acquired. This example is illustrative of the condition where high temporal resolution is not desired at the end of the cycle (e.g. it is geared towards higher resolution over systole and the beginning of diastole, other variations are possible).

Figure 8:
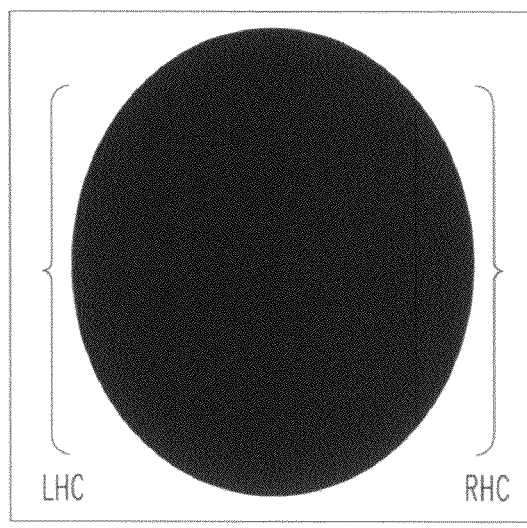
FIG. 8 shows the last two frames of the acquired k-space data are combined such that the even and odd lines of k-space are correctly positioned in the matrix.

The last two time frames are combined such that a fully resolved k-space data set is formed, i.e. data from two successive time frames are combined to form a fully resolved image that satisfies the Nyquist sampling criteria, FIG. 2. In practice there is a fully formed image for each of the separate coil elements 20. Consider the case where there are two coil elements 20, one positioned on the right hand side (RHS) of the body and one on the left hand side (LHS). FIG. 8 shows the last two frames of the acquired k-space data are combined such that the even and odd lines of k-space are correctly positioned in the matrix, and the image produced by Fourier transformation represents a fully resolve, i.e. not folded over, image, represented by the circular feature here. Also illustrated here are two representative coil elements 20, one located on the right hand side of the body (RHS) and one on the left hand side (LHS).

Figure 9:
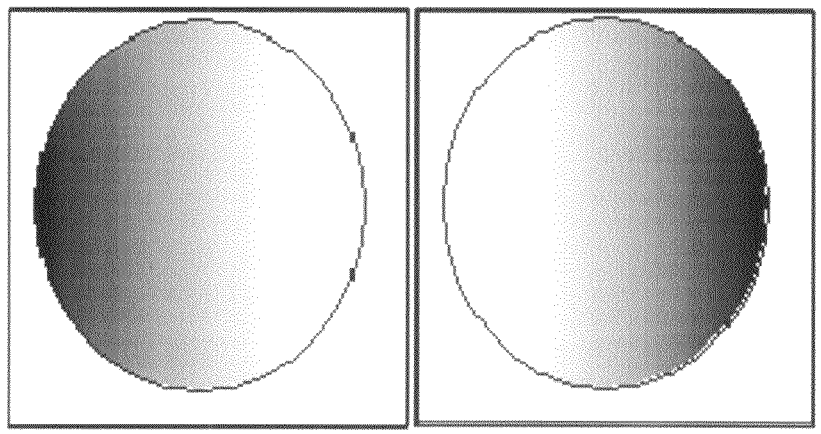
FIG. 9 shows the single frame of the fully resolved image is imaged at different intensities from each of the receiver coil elements.

The intensity variations across the image are dependent on which coil element 20 is used to form that particular image, e.g. the LHS coil has a higher intensity on the LHS of the image, and the RHS coil has a higher intensity on the RHS of the image. FIG. 9 shows the single frame of the fully resolved image is imaged at different intensities from each of the receiver coil elements 20. Illustrated here for two coil elements 20 positioned on diametrically opposite sides of the body, where for the coil element 20 on the left hand side, the left hand section of the body is imaged with increased intensity (represented by darker shading in the first panel). For the coil element 20 on the right hand side, the right hand section of the body is imaged with increased intensity (represented by darker shading in the second panel).

Figure 10:
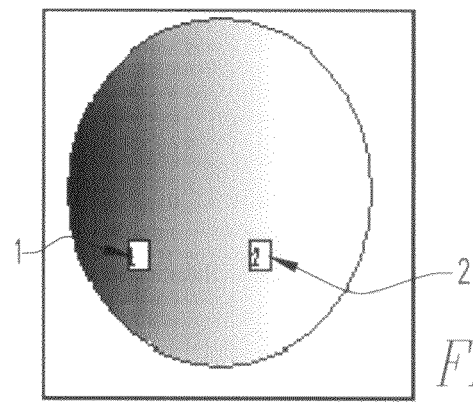
FIG. 10 shows, for the single frame of the fully resolved image for each coil element the ratio map is formed from pixels that would overlap in a folded over image.

In the 2D case, for each of the coil elements 20 separately, the ratio map is formed using the fully resolved image(s). The ratio map corresponds to the intensity ratio of pixels that would overlap in a 50% folded over image. FIG. 10 shows, for the single frame of the fully resolved image for each coil element 20 (shown here for the coil element 20 on the left hand side of the object) the ratio map is formed from pixels that would overlap in a folded over image, e.g. for pixel 1 and pixel 2 the ratio of pixel intensities is formed. For this coil element 20, the ratio operation is performed for all corresponding pixels and stored in a matrix. A separate ratio map is formed for each unfolded over image for each coil element 20. The ratio map only has to occupy half of the image matrix, since it incorporates number from each half of the image.

Figure 11:
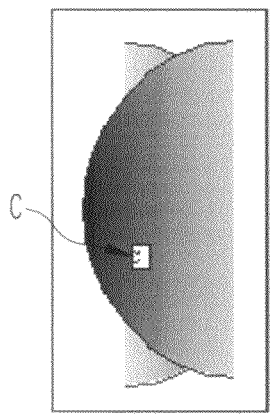
FIG. 11 shows from each of the folded over images for one particular coil element.

For the 2D case, for each coil element 20, folded over images are formed from the k-space lines sampled at alternate time points, FIG. 5. Each pixel contains contributions from two overlapping pixels, the position of each pixel is known from simple geometric considerations already used to form the ratio map. The ratio map information is used to distribute the pixel intensity between the two pixels, one pixel closest to the coil element 20 and one pixel more remote from the coil element 20. FIG. 11 shows from each of the folded over images for one particular coil element 20 (e.g. the left hand coil element 20 in this case), Fourier transform of the k-space matrix results in an image with 50% folded over pixels as indicated. For each pixel, the observed intensity (e.g. C) represents the contribution from the pixel nearest the coil element 20 (e.g. 1 in FIG. 10), and the corresponding pixel furthest from the coil element 20 (e.g. 2 in FIG. 10). The composite pixel is split between the two unfolded over pixel positions according to the following formula:

closest pixel intensity=$R \times C/(R+1)$ where R is the ratio value and C is the observed intensity in the folded over image furthest pixel intensity=$C$−Closest pixel intensity.

Figure 12:
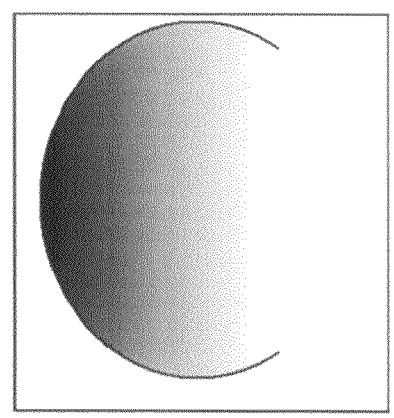
FIG. 12 shows, for each coil element, the unfolding operation works best for the pixels closest to the coil location.

The unfolding operation generally fails to yield good data in the pixels most remote from the coil. FIG. 12 shows, for each coil element 20, the unfolding operation works best for the pixels closest to the coil location (e.g. left hand location in this example). The pixels furthest from the coil are relatively poorly represented, since they are remote from the coil and are thus acquired at a low signal to noise ratio. In this case, these pixels can be set to zero. In this FIG. 12, these pixels can be set to zero. This is not considered a major limitation, since these pixels are poorly seen even in a fully resolved image, and would typically not be examined using that remote coil element 20.

Figure 13:
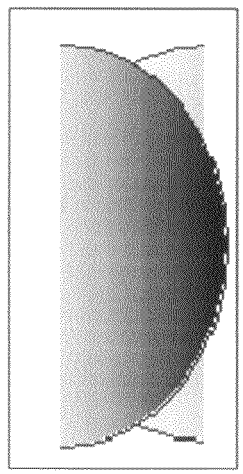
FIG. 13 shows a separate folded over image is available from each coil element.

The unfolding operation can be performed separately for images obtained from each coil element 20. FIG. 13 shows a separate folded over image is available from each coil element 20. In this example, the coil element 20 is located on the right hand side of the body. A ratio map for this coil element 20 is formed as for the other coil elements, and folded over pixel elements are assigned to positions closer or further from the coil as for all other coil elements.

Figure 14:
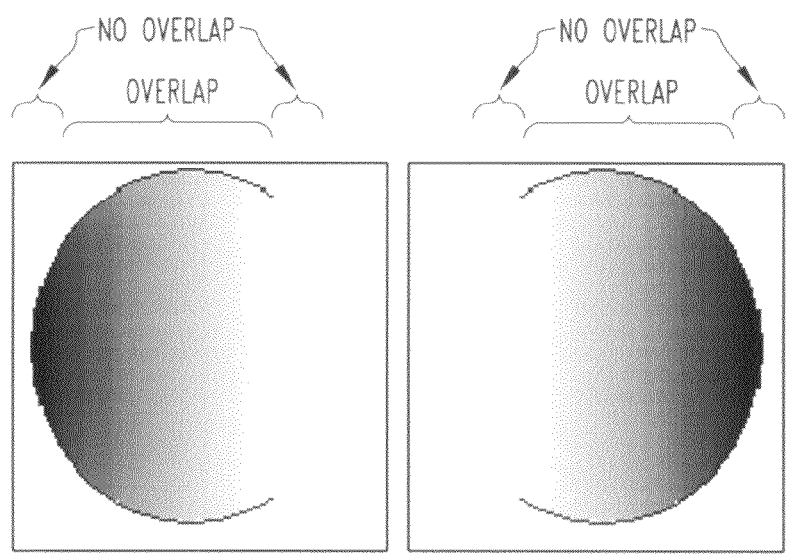
FIG. 14 shows, for opposite coil elements, the unfolded images have opposite edges set to zero.

The separate unfolded images can be combined at the final stage to produce an image with conventional appearance. The operation of combining images is illustrated in FIG. 14. FIG. 14 shows, for opposite coil elements, the unfolded images have opposite edges set to zero. To combine the images into a single composite image, the data are combined as follows: in regions where pixels with non-zero values overlap, the composite pixel is set to the square root of the sum of the squares of the individual pixels; in pixels where only one coil element 20 contributes, the pixel is set to the value of that one coil element 20.

Nyquist Sampling Criteria

The density with which k-space has to be sampled without introducing signal aliasing is governed by the Nyquist sampling criteria. In MRI, the inter-sample separation along the line direction ($\Delta K$) has to exceed or match the Nyquist sample criteria given by:

Field of View=$2 \times \pi / \Delta K$

Figure 15:
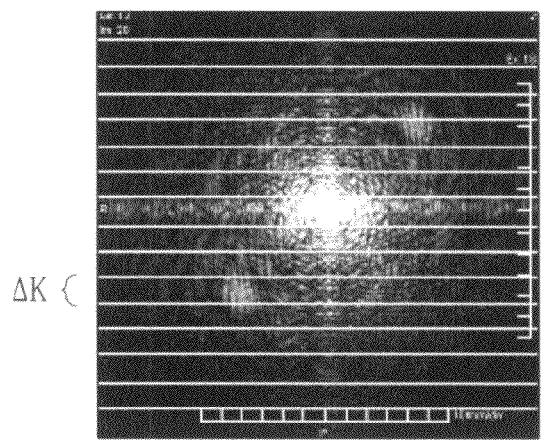
FIG. 15 shows a schematic of the density of sampling of k-space lines that satisfy the Nyquist sampling criteria.

FIG. 14 illustrates that the separation of k-space lines satisfying the Nyquist criteria. FIG. 15 shows a schematic of the density of sampling of k-space lines that satisfy the Nyquist sampling criteria. In this case, Fourier transformation of the k-space data will yield an image without signal aliasing.

To demonstrate how the invention works, data were acquired on a commercial MRI system 12 (General Electric, Excite HD, 1.5 Tesla). When implemented, the invention will be applied to acquired data in the specified manner on an otherwise standard MRI system 12, and process the data in the specified manner. The invention is not restricted to any one type of imaging sequence used for the time resolved acquisition.

Figure 6:
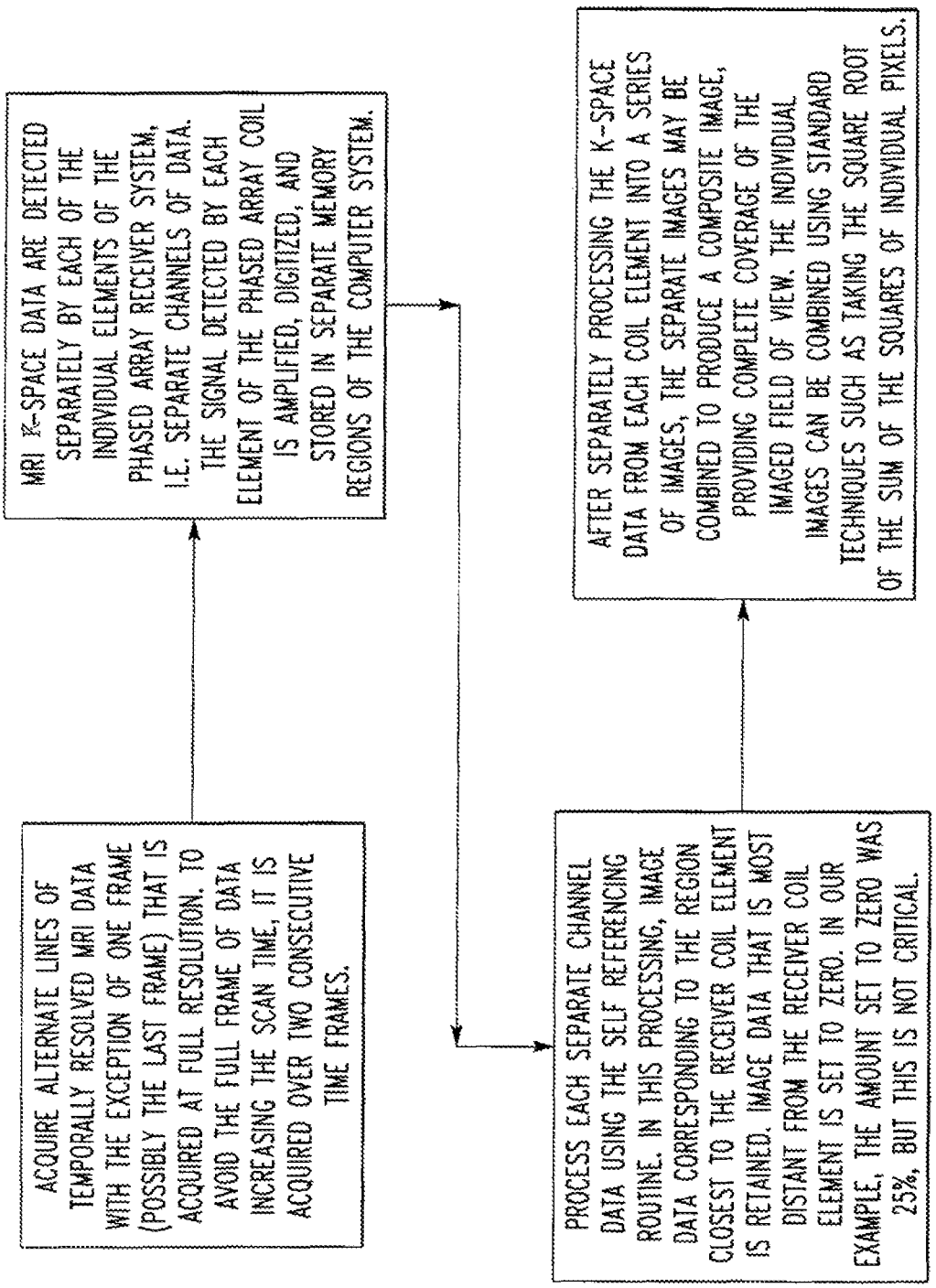
FIG. 6 is a block diagram of a self-referencing process.

In the MRI system 12, a channel represents the combination of receiver coil element 20 signal reception, signal amplification, digitization, filtering, and storage of data in the computer 14 system 12. After the technique described herein has been applied to acquire and process the data from each channel into individual images, corresponding images from each channel can be combined into a composite image. The combination process is not critical, but can be taking the square root of the sum of the squares of individual pixels. FIG. 6 is a block diagram of self-referencing process.

Referring to FIG. 19, in 3D imaging, two axes are generally encoded by the phase encoding imaging operation, represented here as "Horizontal" and "Vertical" directions. The "Measurement" or "Frequency Encoding" direction in this case is represented into the plane of the figure, and is not explicitly represented. With respect to the two phase encoding axes, an individual receiver coil element is positioned such that it is primarily sensitive to pixels in one quadrant. In this example, quadrant 1 contains the primary pixels (for the coil element shown) and quadrants 2, 3, and 4 represent remote quadrants, with low intensity pixels.

Figure 20B:
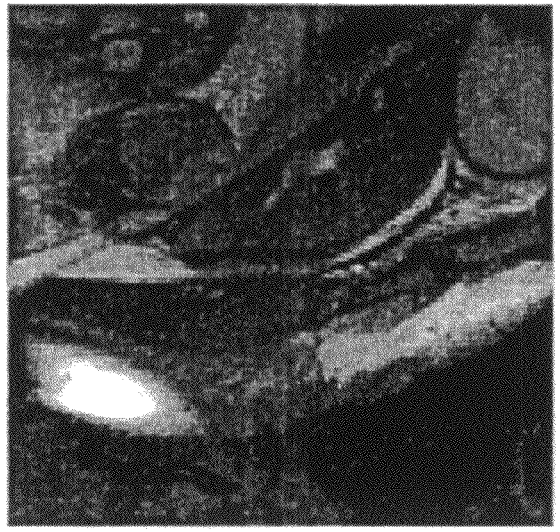
FIGS. 20A and 20B (3D) show that when a sparse sampling factor of 2 is applied to both of the phase encoding axes (i.e. "Horizontal" and "Vertical") then the field of view (FOV) is reduced to one quarter of the full image, and pixels from four quadrants superimpose in the reduced FOV image.
Figure 20A:
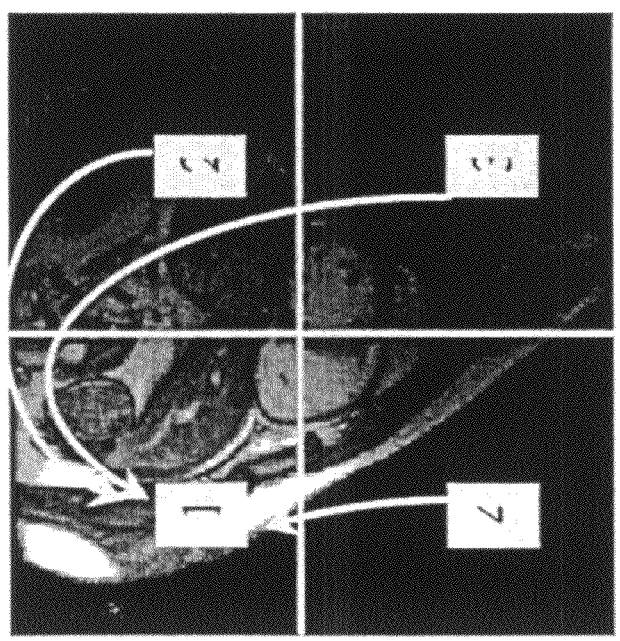

Referring to FIGS. 20A and 20B, in 3D imaging, when reducing the field of view (FOV) by a factor of two along both the "Horizontal" and "Vertical" phase encoding directions, pixels from quadrants 1, 2, 3, and 4 are superposed to produce a folded over image. When imaged using the receiver coil element closes to quadrant 1, the signal intensity will be dominated by pixels in quadrant 1, with pixels from quadrants 2, 3, and 4 regarded as contaminants to the quadrant 1 pixels.

Referring to FIG. 21, in 3D imaging, at progressive points in the cardiac cycle, a series of partial data sets are acquired, such that only every other line corresponding to the "horizontal" and "vertical" phase encoding axes are acquired. In this example, the series of alternate line acquisitions are cycled through the "Even Horizontal" (EH), "Odd Horizontal" (OH), "Even Vertical" (EV) and "Odd Vertical" (OV), such that four consecutive frames can be combined to compile a composite full 3D data set that spans 4 individual time frames.

Figure 22C:
FIGS. 22A, 22B and 22C (3D) show that the folded over data set for one time frame is unfolded by the ratio based pixel assignment of the current invention, and is used in this example to only populate the intensities of the primary quadrant, i.e. the image quadrant in which the receiver coil element produces the most signal.
Figure 22B:
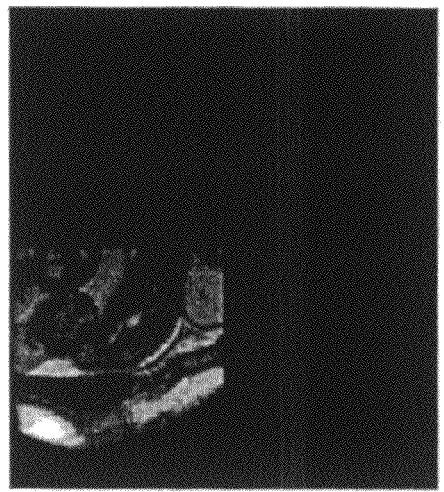
Figure 22A:

Referring to FIGS. 22A, 22B and 22C, in 3D imaging, the result of sampling alternate lines along the two phase encoding axes results in an image with the field of view halved in the "horizontal" and "vertical" directions, resulting in the folded over image. The pixel assignment operation in the current invention (Single Coil Parallel Imaging approach) is applied to the folded over image (in this simulation using 2D data) to produce the unfolded pixel intensity only for the primary quadrant. In this example, the pixel intensities in the 3 remote quadrants are not assigned. In comparison to the full FOV image, it can be appreciated that loss of these pixels is of minor importance, as they are imaged with relative low intensity by this coil element. To assign pixel intensities to the remaining 3 quadrants in this example, similar operations are performed for the primary coil elements closest to the respective quadrants. Note that data to populate all quadrants are acquired simultaneously.

The single coil implementation parallel imaging (SCIPI) for 3D has been largely described in terms of cardiac, time resolved imaging, but is not restricted to this application, and is generally applicable to any time resolved situation. Here three additional examples of its applicability are given, and show that the invention can be customized to optimize performance in multiple situations. The essential features of the invention remain invariant: overlapping pixels in a reduced image matrix are separated and assigned to their correct position, at least in the primary section (e.g. half or quarter of the full image) using information obtained from a single coil element.

Functional Brain Imaging

In functional brain imaging, a stimuli is applied periodically and a dynamic MRI series is acquired at multiple time points. In this example, as is common to ECG triggered cardiac imaging, the dynamic k-space series can be compiled over multiple cycles of the stimuli, allowing k-space to be compiled over an extended time, well beyond a single application of the stimuli. The reduced sampling scheme and reconstruction approach of SCIPI can be directly applied to this application, without major modification. In functional brain imaging, it is more typical to use 3D imaging (compared to 2D) and typically only an extremely limited and highly localized region of the brain is activated with other regions of the brain remaining essentially unchanged, providing excellent conditions for application of SCIPI.

Contrast Angiography

In the case of contrast angiography, a bolus of contrast agent is administered and images are obtained (typically 3D, but sometimes in a 2D thick slice, projective manner) as the contrast agent passes through the vessels in the imaged region. In this situation, conditions are typically arranged such that, primarily, dynamic changes are related to the passage of the contrast agent without confounding changes in configuration of the body, e.g. respiration is suspended, or a limb is held steady. Further, the passage of the contrast agent is generally so rapid that only one 3D data set can typically be acquired under optimal contrast conditions. Thus, a high degree of co-ordination is required between administration of the contrast agent and acquisition of the MRI data. Further, it is possible that the physiology of the vascular system does not deliver the contrast agent to all vessels of interest at the same time (e.g. a dissected aorta may experience early filling of the true lumen and late filling of the false lumen) making an angiogram at a single time point possibly providing misleading information. Thus, it is often desirable to acquire the angiographic data in a time resolved manner. The present invention can be applied to image passage of the contrast agent in a reduced time per frame, permitting time resolved angiography to be performed. Again, the conditions under which angiography are performed are ideally suited to the current invention, where the major dynamic changes in intensity occur in the blood vessel and surrounding tissue is largely static.

Currently, approaches to obtain time resolved angiography involve sparse sampling k-space data combined with interpolation over the time series. These approaches suffer the severe limitation that respiratory or peristaltic motion occurring at one time point can be projected forward and backward in time (due to the interpolation process) and thus contaminate an extended number of frames. For this reason, these approaches are rarely applied to the thoracic region. A potential advantage of the current invention is that dynamic changes such as these can potentially be accommodated, since at each time point, only the data obtained at that time point contributes to the image, providing that the ratio map is adequate. The key feature in this case being the manner in which the ratio map is generated. In the case of slight changes occurring in configuration of the body between time points, the manner of generating the ratio map using the "max-min" operation will likely correctly render image features that are not truly static and without contaminating prior or following frames. Alternatively, if a separate ratio map is generated for each frame, again, the dynamic features will be correctly assigned, but in this case, images may suffer increased noise. The variant in which the alternate lines are cycled between phase encoding directions over a cycle of four time frames allows generation of a dynamic ratio map, but each frame may have a slightly different level of background intensity related to signal phase changes that occur due to slight differences in the k-space sampling pattern. However, the advantage of this approach is that fine vessel detail will likely be detectable, and if rendering as a maximum intensity projection, the slight differences in background intensity between successive frames will likely not result in distracting intensity level changes.

Dynamic Mass Detection

The degree to which masses in the body are supplied by blood is used to distinguish features such as composition of the mass and potential for being malignant. Often, a contrast agent is administered and a series of time resolved (typically 3D) images are acquired to detect differences in arrival time of the contrast agent in the masses compared to normal tissue. The present invention could be used to allow rapid time resolution and be used to increase spatial resolution compared to what is conventionally performed, potentially allowing smaller masses to be routinely detected.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:

1. An imaging apparatus for an object in change comprising:
   an MRI system having a computer, wherein a first channel of the MRI system is configured to produce images of the object in change using alternate lines of k-space applied along each of two phase encoding directions for a plurality of time points, wherein the computer is configured to combine the images into a composite 3D image of the object, wherein the MRI system is configured to acquire alternate lines of temporally resolved data along each of the two phase encoding directions, such that at any one time point at least 25% of k-space data required to satisfy Nyquist sampling criteria for the object in change is acquired, and wherein the MRI system is further configured to not translate the object as the first channel produces images of the object,
   wherein the first channel includes a coil element and a signal receiver which retains image data corresponding to a region adjacent to the coil element, the region including at least 25% of the data,
   wherein the computer is configured to form a ratio map for the coil element using a fully resolved image using the following formula: R=PP/(RP2+RP3+RP4),
   where R is a ratio map value, PP is a pixel in a closest quadrant to the coil element of the quadrants of the fully resolved image and RP2, RP3, and RP4 are pixel values in remote quadrants of the fully resolved image.

2. An apparatus as described in claim 1 wherein the MRI system is configured to acquire even lined datasets only of even lines during even-numbered time points in a series and odd lined data points only of odd lines during odd numbered time points in the series.

3. An apparatus as described in claim 2, wherein the plurality of time points comprises at least four time points, and wherein the MRI system is configured to acquire the alternate lines in a progressive manner along each of two phase encoding axes such that full data having all even and all odd lined datasets is combined from every four consecutive time points of the plurality of time points.

4. An apparatus as described in claim 3 wherein the even lined datasets correspond to even-numbered cardiac phases and odd lined datasets correspond to odd-numbered cardiac phases.

5. An apparatus as described in claim 1 wherein, at each of the plurality of time points, the MRI system is configured to acquire alternate lines along each phase encoding direction including all even lines or all odd lines and a contiguous number of lines comprising 10% of k-space data required to satisfy Nyquist sampling criteria for the object in change at a center of k-space.

6. An apparatus as described in claim 1 wherein the ratio map corresponds to an intensity ratio of pixels that would overlap in a folded over image in which data from remote quadrants is overlaid on the closest quadrant to the coil element of the quadrants of the fully resolved image.

7. An apparatus as described in claim 1 wherein the computer is configured to use the ratio map to distribute pixel intensity only to the pixel in the closest quadrant to the coil element of the quadrants of the fully resolved image.

8. An apparatus as described in claim 1 wherein a composite pixel is assigned to a primary unfolded pixel position, forming an image of at least 25% of the fully resolved image according to the formula $$\text{primary pixel intensity} = R \times C/(R+1)$$

where R is the ratio map value and C is the observed intensity in the folded over image,
wherein the primary unfolded pixel position comprises a pixel in the closest quadrant to the coil element of the quadrants of the fully resolved image.

* * * * *